United States Patent
Takemura (10) Patent No.: US 9,001,564 B2
(45) Date of Patent: Apr. 7, 2015

(54) SEMICONDUCTOR DEVICE AND A METHOD FOR DRIVING THE SAME

(75) Inventor: Yasuhiko Takemura, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 331 days.

(21) Appl. No.: 13/532,117

(22) Filed: Jun. 25, 2012

(65) Prior Publication Data

US 2013/0003441 A1 Jan. 3, 2013

(30) Foreign Application Priority Data

Jun. 29, 2011 (JP) ................. 2011-143668

(51) Int. Cl.
*G11C 11/24* (2006.01)
*G11C 11/401* (2006.01)
*H01L 27/115* (2006.01)
*G11C 11/403* (2006.01)
*H01L 21/8234* (2006.01)
*H01L 21/8238* (2006.01)
*H01L 29/49* (2006.01)
*H01L 29/66* (2006.01)
*G11C 16/04* (2006.01)

(52) U.S. Cl.
CPC .......... *H01L 27/1156* (2013.01); *G11C 11/403* (2013.01); *H01L 21/82345* (2013.01); *H01L 21/823842* (2013.01); *H01L 29/4966* (2013.01); *H01L 29/66545* (2013.01); *G11C 16/0433* (2013.01)

(58) Field of Classification Search
USPC ........ 365/149, 187, 189.15, 189.19; 257/407
See application file for complete search history.

(56) References Cited

U.S. PATENT DOCUMENTS

| | | | |
|---|---|---|---|
| 4,656,492 A | 4/1987 | Sunami et al. |
| 4,805,138 A | 2/1989 | McElroy et al. |
| 4,884,239 A | 11/1989 | Ono et al. |
| 5,200,350 A | 4/1993 | Gill et al. |
| 5,245,207 A | 9/1993 | Mikoshiba et al. |
| 5,364,807 A | 11/1994 | Hwang |
| 5,424,233 A | 6/1995 | Yang et al. |
| 5,535,158 A | 7/1996 | Yamagata |
| 6,815,755 B2 | 11/2004 | Colclaser et al. |
| 7,482,619 B2 | 1/2009 | Seol et al. |
| 7,518,178 B2 | 4/2009 | Takashima et al. |
| 7,550,802 B2 | 6/2009 | Koyanagi et al. |
| 7,560,767 B2 | 7/2009 | Yasuda et al. |

(Continued)

OTHER PUBLICATIONS

R.E. Jones et al.; "Evidence for p-Type Doping of InN"; Physical Review Letters; Mar. 31, 2006; pp. 125505-1-125505-4; vol. 96.

(Continued)

*Primary Examiner* — J. H. Hur
(74) *Attorney, Agent, or Firm* — Fish & Richardson P.C.

(57) ABSTRACT

It is an object to reduce power consumption of a 2Tr1C type semiconductor memory device. The absolute value of the threshold voltage of a reading transistor is made larger than a fluctuation range of a data potential of a bit line (or the fluctuation range of the data potential of the bit line is made smaller than the absolute value of the threshold voltage of the reading transistor), whereby the potential of a source line can be fixed, a fluctuation in a potential of a writing word line can be made smaller, and a potential of a reading word line is fluctuated only at the time of reading. Further, a gate of such a transistor the absolute value of the threshold voltage of which is large is formed using a material having a high work function, such as indium nitride.

14 Claims, 7 Drawing Sheets

(56) References Cited

U.S. PATENT DOCUMENTS

| | | |
|---|---|---|
| 7,659,158 B2 | 2/2010 | Ma et al. |
| 7,667,273 B2 | 2/2010 | Koyama et al. |
| 7,772,053 B2 | 8/2010 | Kameshiro et al. |
| 7,902,588 B2 | 3/2011 | Nishikawa et al. |
| 7,923,364 B2 | 4/2011 | Goda |
| 7,989,289 B2 | 8/2011 | Krishnamohan et al. |
| 8,575,678 B2 | 11/2013 | Takemura |
| 2003/0008444 A1 | 1/2003 | Snyder |
| 2003/0215992 A1 | 11/2003 | Sohn et al. |
| 2004/0110351 A1 | 6/2004 | Narasimha |
| 2004/0227186 A1 | 11/2004 | Saito et al. |
| 2005/0073871 A1* | 4/2005 | Luk et al. ............ 365/149 |
| 2005/0148133 A1 | 7/2005 | Chen et al. |
| 2007/0131968 A1* | 6/2007 | Morita et al. .......... 257/192 |
| 2007/0290264 A1 | 12/2007 | Sugii et al. |
| 2008/0087939 A1 | 4/2008 | Nara |
| 2008/0128517 A1 | 6/2008 | Yukawa et al. |
| 2008/0185635 A1 | 8/2008 | Yanagi et al. |
| 2009/0001471 A1* | 1/2009 | Ohmi et al. ........... 257/351 |
| 2009/0045397 A1* | 2/2009 | Iwasaki ................ 257/43 |
| 2009/0250755 A1 | 10/2009 | Ohmi et al. |
| 2011/0101351 A1 | 5/2011 | Yamazaki |
| 2011/0121381 A1 | 5/2011 | Kanemura et al. |
| 2011/0182110 A1 | 7/2011 | Yamazaki et al. |
| 2011/0227074 A1 | 9/2011 | Kato et al. |
| 2011/0228584 A1 | 9/2011 | Takemura |
| 2011/0260158 A1 | 10/2011 | Takemura |
| 2011/0278571 A1 | 11/2011 | Yamazaki et al. |
| 2011/0297939 A1 | 12/2011 | Kato |
| 2012/0098072 A1 | 4/2012 | Han et al. |
| 2012/0127796 A1 | 5/2012 | Eitan et al. |
| 2012/0146109 A1 | 6/2012 | Yamazaki et al. |
| 2012/0181597 A1 | 7/2012 | Takemura |

OTHER PUBLICATIONS

W. Walukiewicz; "Intrinsic limitations to the doping of wide-gap semiconductors"; Physica B; 2001; pp. 123-134; vol. 302-303.

John Robertson; "Band offsets of wide-band-gap oxides and implications for future electronic devices"; Journal of Vacuum Science & Technology B; May 1, 2000; pp. 1785-1791; vol. 18, No. 3.

Masaki Nakamura et al.; "The Phase Relations in the In2O3-Ga2ZnO4-ZnO System at 1350° C"; Journal of Solid State Chemistry; Aug. 1, 1991; pp. 298-315; vol. 93, No. 2.

Kiyoshi Takeuchi et al.; "Channel Engineering for the Reduction of Random-Dopant-Placement-Induced Threshold Voltage Fluctuation"; IEDM 97: Technical Digest of International Electron Devices Meeting; Dec. 7, 1997; pp. 841-844.

Lun-Chun Chen et al.; "Poly-Si Nanowire Nonvolatile Memory With Nanocrystal Indium-Gallium-Zinc-Oxide Charge-Trapping Layer"; IEEE Electron Device Letters; Dec. 1, 2010; pp. 1407-1409; vol. 31, No. 12; IEEE.

* cited by examiner

SEMICONDUCTOR DEVICE AND A METHOD FOR DRIVING THE SAME

BACKGROUND OF THE INVENTION

1. Field of the Invention

The present invention relates to a memory device including a semiconductor and a semiconductor device.

2. Description of the Related Art

In recent years, it has been found that electric charge can be retained for a very long period of time by utilizing the very low off-state current of transistors formed using an oxide semiconductor whose band gap is twice or more times that of silicon. For example, the theoretical off-state current (drain current in the off state) of a semiconductor with a band gap of 2.5 eV or more is $10^{-26}$ A or less. The band gap of indium-zinc-gallium oxide which is one of oxide semiconductors (see Non Patent Document 1) is 3.2 eV; thus, the theoretical off-state current is $10^{-31}$ A or less.

Further, although the off-state current cannot be reduced to the above value, the off-state current of a transistor using an extremely thin film of silicon can be lower than that of a normal transistor by three orders of magnitude (see Patent Document 1).

Figure 1:
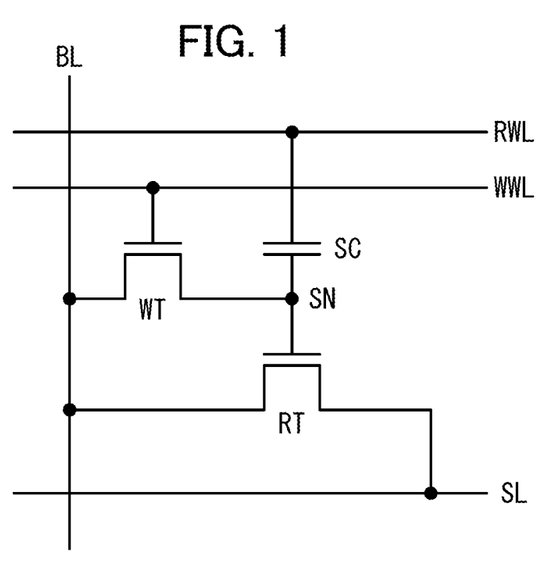
FIG. 1 is a diagram illustrating an example of a circuit of a semiconductor memory device of the present invention.

The use of a memory circuit formed utilizing this as a nonvolatile memory has been proposed (see Patent Documents 1 to 3). FIG. 1 is a circuit diagram of a memory cell in a semiconductor memory device disclosed in each of Patent Documents 1 to 3. The memory cell includes a writing transistor WT, a reading transistor RT, and a storage capacitor SC. Therefore, such a semiconductor memory device is also called a 2Tr1C type semiconductor memory device. A source of the writing transistor WT, a gate of the reading transistor RT, and one electrode of the storage capacitor SC are connected to one another. This portion is called a storage node SN.

Further, a gate of the writing transistor WT is connected to a writing word line WWL, a drain of the writing transistor WT is connected to a bit line BL, a drain of the reading transistor RT is connected to the bit line BL, a source of the reading transistor RT is connected to a source line SL, and the other electrode of the storage capacitor SC is connected to a reading word line RWL.

Since the writing transistor WT formed using an oxide semiconductor has extremely low off-state current, electric charge in the storage capacitor SC can be retained for a sufficient period of time. Further, the electric charge in the storage capacitor SC does not leak at the time of reading, and data is not corrupted at the time of reading.

A normal transistor using silicon is used as the reading transistor RT. Therefore, the absolute value of the threshold voltage of the reading transistor RT is generally lower than 1V. Note that in this specification, when the transistor is an N-channel transistor, the threshold voltage has a positive value, whereas when the transistor is a P-channel transistor, the threshold voltage has a negative value. Accordingly, in this specification, a transistor having a threshold voltage of a positive value is an N-channel transistor, whereas a transistor having a threshold voltage of a negative value is a P-channel transistor.

An operation of the memory cell having such a structure will be described with reference to FIGS. 3A to 3D and FIGS. 4A and 4B. Here, when a potential of the storage capacitor SC is set to 0V or +1 V, data is stored. In order to achieve this, a potential of the bit line BL needs to be 0V or +1 V. Such a potential of the bit line BL is called a data potential. Further, the threshold voltage of the reading transistor WT is set to +1 V, and the threshold voltage of the reading transistor RT is set to +0.5 V.

At the time of data writing, for example, when the potential of the source line SL is set to 0 V, the potential of the bit line BL is set to +1 V, and a potential of the writing word line WWL is set to +2 V, the writing transistor WT is turned on. Further, the potential of the storage node SN is +1 V, and thus the reading transistor RT is also turned on and current flows between the bit line BL and the source line SL, which causes an increase in power consumption (see FIG. 3A).

In order to prevent generation of such a current, the potential of the source line SL is preferably higher than 0V. For example, when the potential of the source line SL is set to +1 V, the current generated in FIG. 3A can be suppressed (see FIG. 3B).

Figure 3A:
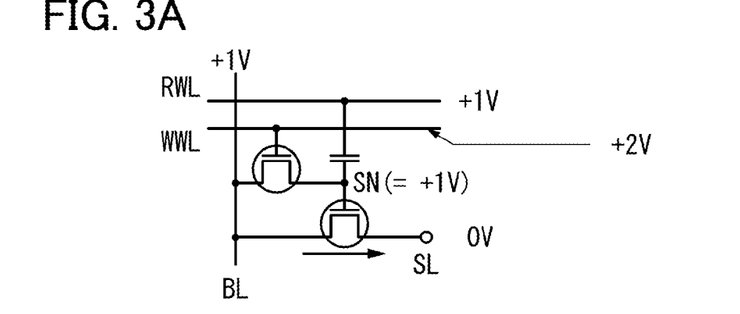
FIGS. 3A to 3D are diagrams illustrating an example of an operation of a conventional semiconductor memory device.
Figure 3B:
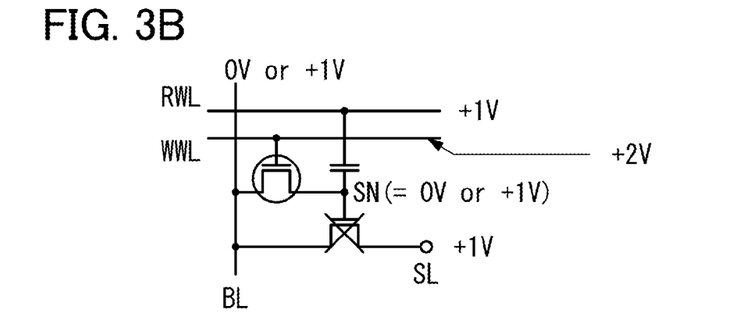

When the potential of the source line SL is set to +1 V and the potential of the bit line BL is +1 V, the potentials of the drain, the source, and the gate of the reading transistor RT are each +1 V, and thus the reading transistor RT is off. Further, when the potential of the bit line BL is 0V, the potentials of the source and the gate are each 0 V, and thus the reading transistor RT is off. As described above, power consumption can be reduced.

Figure 3C:
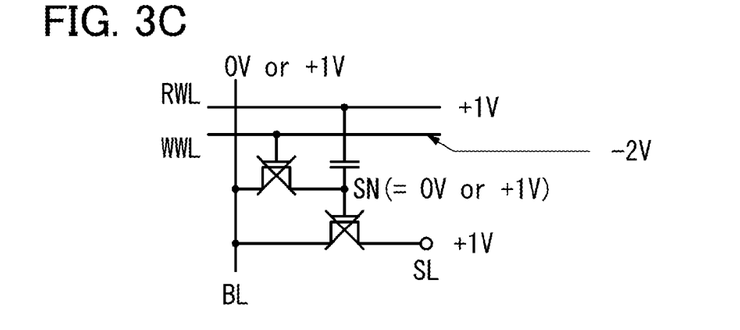

When writing is completed, the potential of the writing word line WWL is set to −2 V, and the writing transistor WT is turned off (see FIG. 3C). In order to sufficiently reduce the off-state current of the writing transistor WT, the potential of the gate is preferably lower than one of the potentials of the source and the drain, which is lower than the other, by 0.5 V or more, preferably 1 V or more.

When the potential of the source of the writing transistor WT is higher than or equal to 0 V, the potential of the writing word line WWL may be −1 V. However, as described later, the minimum potential of the source of the writing transistor WT is −1V, and thus the potential of the writing word line WWL needs to be −2 V in order to reduce the off-state current sufficiently.

Figure 3D:
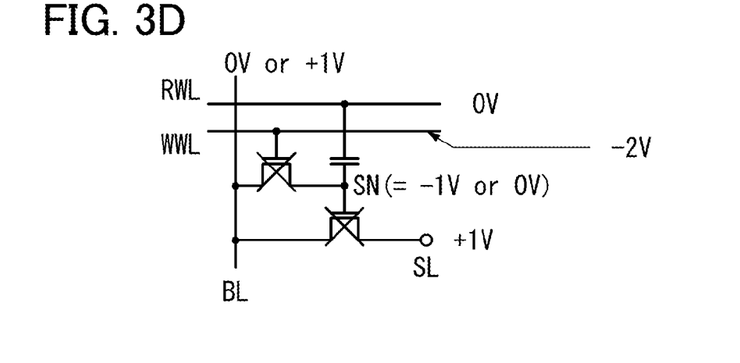

Next, the potential of the reading word line RWL is reduced from +1 V to 0 V (see FIG. 3D). This is in order to keep the reading transistor RT off. The potential of the storage node SN is −1 V or 0 V. This state is a standby state. During the period in which data is not written to the memory cell or data is not read from the memory cell, the semiconductor memory device is kept in this state, whereby power consumption can be reduced.

Figure 4A:
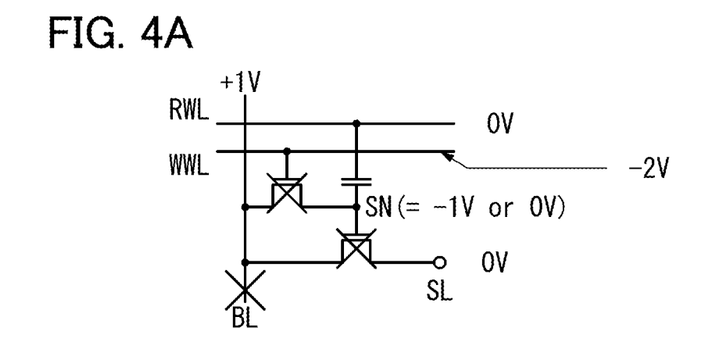
FIGS. 4A and 4B are diagrams illustrating an example of an operation of the conventional semiconductor memory device.

At the time of reading data, the potential of the source line SL is set to 0 V, and the bit line BL is charged to +1 V and then put in a floating state (see FIG. 4A). Further, when the potential of the reading word line RWL is set to +1 V, by the capacitive coupling through the storage capacitor SC, the potential of the storage node SN is 0 V or +1 V (see FIG. 4B).

Figure 4B:
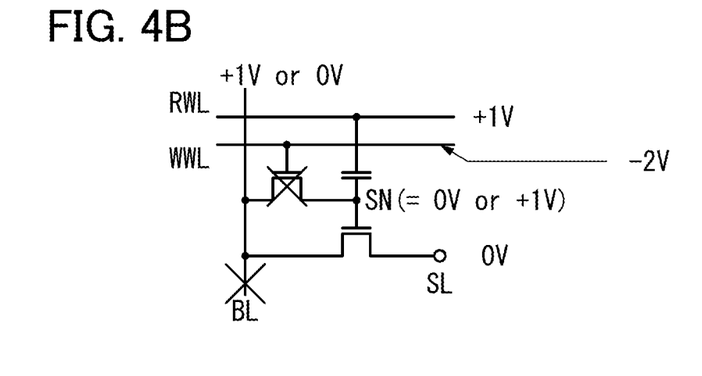

When the potential of the storage node SN is 0 V, the reading transistor RT is off, and thus the potential of the bit line BL remains at +1 V. On the other hand, when the potential of the storage node SN is +1 V, the potential of the bit line BL is 0 V. As described above, by utilizing variation in potential of the bit line BL depending on stored data, data can be read.

REFERENCE

Patent Document

[Patent Document 1] U.S. Pat. No. 7,772,053
[Patent Document 2] United States Patent Application Publication No. 2011/0101351

[Patent Document 3] United States Patent Application Publication No. 2011/0182110

Non-Patent Document

[Non-Patent Document] M. Nakamura, N. Kimizuka, and T. Mohri, "The Phase Relations in the $In_2O_3$—$Ga_2ZnO_4$—ZnO System at 1350°C.", *J. Solid State Chem.*, 1991, Vol. 93, pp. 298-315

SUMMARY OF THE INVENTION

An object of one embodiment of the present invention is to provide a semiconductor device (or a semiconductor memory device) in which power consumption can be reduced and a method for driving the semiconductor device (or the semiconductor memory device). Further, another object of one embodiment of the present invention is to provide a semiconductor device (or a semiconductor memory device) having a novel structure and a method for driving the semiconductor device (or the semiconductor memory device), in particular, to provide a novel semiconductor device (or a novel semiconductor memory device) in which power consumption can be reduced and a method for driving the semiconductor device (or the semiconductor memory device).

The present invention will be described below; terms used in this specification are briefly described. First, when one of a source and a drain of a transistor is called a drain, the other is called a source in this specification. That is, they are not distinguished depending on the potential level. Therefore, a portion called a source in this specification can be alternatively referred to as a drain.

Further, even when the expression "be connected" is used in this specification, there is a case in which no physical connection is made in an actual circuit and a wiring is just extended. For example, there is a case in which one wiring serves as gates of a plurality of transistors. In that case, one wiring which branches into gates may be illustrated in a circuit diagram. Even in such a case, the expression "a wiring is connected to a gate" may be used in this specification.

One embodiment of the present invention is a semiconductor device including one or more writing word lines; one or more reading word lines; one or more bit lines; one or more source lines; a writing transistor; a reading transistor; and a capacitor. Further, a source of the writing transistor, a gate of the reading transistor, and one electrode of the capacitor are connected to one another, a gate of the writing transistor is connected to the writing word line, a drain of the writing transistor and a drain of the reading transistor are connected to the bit line, a source of the reading transistor is connected to the source line, and the absolute value of the threshold voltage of the reading transistor is larger than a fluctuation range of a data potential of the bit line.

Another embodiment of the present invention is a semiconductor device including one or more writing word lines; one or more reading word lines; one or more bit lines; one or more source lines; an n-channel writing transistor; a reading transistor; and a capacitor. Further, a source of the writing transistor, a gate of the reading transistor, and one electrode of the capacitor are connected to one another, a gate of the writing transistor is connected to the writing word line, a drain of the writing transistor is connected to the bit line, a drain of the reading transistor is connected to the bit line, a source of the reading transistor is connected to the source line, and the gate of the reading transistor is formed using a material having a work function higher than or equal to 5.2 eV.

Another embodiment of the present invention is a method for driving a semiconductor device including one or more writing word lines; one or more reading word lines; one or more source lines; one or more bit lines; a writing transistor; a reading transistor; and a capacitor, in which a source of the writing transistor, a gate of the reading transistor, and one electrode of the capacitor are connected to one another, a gate of the writing transistor is connected to the writing word line, a drain of the writing transistor and a drain of the reading transistor are connected to the bit line, and a source of the reading transistor is connected to the source line. In the method, a fluctuation range of a data potential of the bit line is made smaller than the absolute value of the threshold voltage of the reading transistor.

In the above, a compound containing nitrogen and at least one of indium and zinc may be used for the gate of the reading transistor. Further, in the above, a value obtained by subtracting the minimum potential of the writing word line from the minimum potential of the bit line may be higher than or equal to 0.5 V. Furthermore, in the above, the potential of the source line may be fixed.

Moreover, in the above, the writing transistor may be formed using an oxide semiconductor. Further, in the above, the writing transistor may be formed using a semiconductor with a band gap higher than or equal to 2.5 eV. Furthermore, in the above, the writing transistor may be formed using silicon or other semiconductors with a thickness less than or equal to 5 nm, preferably less than or equal to 1 nm. In addition, in the above, the reading transistor may be formed using single crystal silicon.

The operations of the semiconductor memory device described with reference to FIGS. 3A to 3D and FIGS. 4A and 4B have the following features. A feature is that the potential of the source line SL at the time of writing needs to be different from the potential of the source line SL at the time of reading. In the example above, the potential at the time of writing is +1 V and the potential at the time of reading is 0 V. Another feature is that a fluctuation in the potential of the writing word line is 4 V, which is from −2 V to +2 V. Another feature is that the potential of the reading word line RWL needs to be fluctuated at the time of writing and reading. In the example above, the potential at the time of writing and reading is +1 V, and the potential at the time other than the time of writing and reading is 0 V.

In order to reduce power consumption of the semiconductor memory device, a fluctuation in a potential of a wiring such as a word line is preferably eliminated or reduced. The present inventor has found that the absolute value of the threshold voltage of the reading transistor RT is made larger than a fluctuation range of the data potential of the bit line, whereby the potential of the source line SL can be fixed, a fluctuation in the potential of the writing word line can be made smaller, and the potential of the reading word line may be fluctuated only at the time of reading.

In general, the fluctuation range of the data potential of the bit line is greater than or equal to 0.7 V, usually greater than or equal to 1 V. In order to make the absolute value of the threshold voltage of the reading transistor RT larger than the above value, there are several methods. A first method is to change the Fermi level of a region where a channel is formed. In the method, the degree of p-type conductivity in a region where the channel is formed is increased when the reading transistor RT is an n-channel transistor, and thus a difference between the Fermi level and a vacuum level (a work function) is made larger. In this method, when the region where the channel is formed is formed using silicon, the maximum threshold voltage can be +1.1 V.

However, in this method, an impurity concentration in the channel is high, which results in a reduction in the mobility of the reading transistor RT. Further, both the drain and the channel have a high impurity concentration, and thus junction leakage current due to a tunneling effect is generated between the drain and the channel.

A second method is to change the work function of the gate. In the method, when the reading transistor RT is an n-channel transistor, a material with a high work function is used for the gate of the reading transistor RT. For example, when a degenerate p-type silicon with a work function of 5.2 eV is used for the gate of the reading transistor RT, the threshold voltage of the reading transistor RT is +1.1 V.

In this case, the above conditions are theoretically satisfied even when the fluctuation range of the data potential is 1V, and thus, operation in the above mode is possible under limited conditions. However, actually, in consideration of a fluctuation or operation stability, it is preferable that a difference between the absolute value of the threshold voltage of the reading transistor RT and the fluctuation range of the data potential be larger than the absolute value of the threshold voltage of each of other transistors used for a driver circuit or the like.

For example, when the absolute value of the threshold voltage of each of the other transistors used for a driver circuit or the like is 0.5 V and the fluctuation range of the data potential is 1 V, the absolute value of the threshold voltage of the reading transistor RT is preferably greater than or equal to 1.5 V. Further, when the absolute value of the threshold voltage of each of the other transistors used for a driver circuit or the like is 0.3 V and the fluctuation range of the data potential is 0.7 V, the absolute value of the threshold voltage of the reading transistor RT is preferably greater than or equal to 1 V. Under the above conditions, even a transistor the absolute value of which threshold voltage is 1.1 V can be used as the reading transistor RT.

In other words, in the case of using degenerate p-type silicon for the gate of the reading transistor RT, it is necessary to lower the absolute value of the threshold voltage of each of the other transistors used for a driver circuit or the like or to reduce the fluctuation range of the data potential. However, there is a disadvantage that when the absolute value of the threshold voltage of each of the other transistors used for a driver circuit or the like is lowered, the amount of leakage current of the whole circuit is remarkably increased (when the absolute value of the threshold voltage is lowered by 0.1 V, the amount of leakage current is increased by 10 times or more). Further, when the fluctuation range of the data potential is reduced, the probability of the occurrence of an error by noise becomes high.

As another material with a high work function, an n-type semiconductor which contains nitrogen and at least one of indium and zinc and whose work function is higher than or equal to 5.3 eV (hereinafter also referred to as a high-work-function compound semiconductor) can be given. Some of such materials have a work function higher than or equal to 5.5 eV; therefore, when they are used for the gate, the threshold voltage is greater than or equal to +1.4 V. Note that the carrier concentration in the high-work-function compound semiconductor is preferably greater than or equal to $1\times10^{19}$ cm$^{-3}$.

Here, the high-work-function compound semiconductor contains nitrogen at a concentration of greater than or equal to 5 at. % and less than or equal to 50 at. %. Further, the high-work-function compound semiconductor desirably contains zinc at a concentration of greater than or equal to 5 at. % and less than or equal to 66.7 at. %, or indium at a concentration of greater than or equal to 5 at. % and less than or equal to 50 at. %.

The high-work-function compound semiconductor may contain a metal element with an atomic number of 20 or less at a concentration of 1 at. % or less, preferably 0.01 at. % or less. The high-work-function compound semiconductor may contain oxygen or another metal element with an atomic number of 21 or more. The high-work-function compound semiconductor may contain hydrogen at a concentration of 0.01 at. % to 10 at. %.

The high-work-function compound semiconductor may be a single crystal or polycrystal body having a wurtzite-type crystal structure. The high-work-function compound semiconductor may have a hexagonal or cubic crystal structure other than the wurtzite type.

The electron affinity of the above high-work-function compound semiconductor is greater than or equal to 5.3 eV. Therefore, many of defect levels formed at levels which are 4 eV to 5 eV below the vacuum level (typically, the level which is 4.9 eV below the vacuum level) serve as donors, and an n-type semiconductor having an electron concentration of greater than or equal to $1\times10^{19}$ cm$^{-3}$, preferably greater than or equal to $1\times10^{20}$ cm$^{-3}$ is provided without particular doping treatment (for details, see W. Walukiewicz, "Intrinsic limitations to the doping of wide-gap semiconductors", Physica B 302-303, pp. 123-134, 2001).

Indium nitride with a chemical formula of InN is given as an example of the above-described high-work-function compound semiconductor. Indium nitride is a semiconductor with a band gap less than or equal to 0.7 eV and an electron affinity of greater than or equal to 5.6 eV. It is known that indium nitride has a wurtzite type structure.

Zinc nitride known as having a chemical formula of $Zn_3N_2$ is given as another example. The details of the physical values of zinc nitride have not been known; however, it has been clarified that the electron affinity thereof is greater than or equal to 5.5 eV. It is known that zinc nitride has a cubic crystal structure.

Such a high-work-function compound semiconductor may be manufactured by a known method, such as a sputtering method, a vacuum evaporation method, an ion plating method, an MBE (molecular beam epitaxy) method, a CVD method (an MOCVD (metal organic CVD) method or an ALD (atomic layer deposition) method), or the like.

For example, when gallium indium nitride ($In_{1-a}Ga_aN$) is manufactured by an MOCVD method, trimethylindium (($CH_3)_3In$), trimethylgallium (($CH_3)_3Ga$), and ammonia may be used as source gases and the substrate temperature may be set to 350° C. to 550° C.

As described above, there are high-work-function compound semiconductors with a work function of greater than or equal to 5.5 eV. Therefore, in the case where silicon oxide is bonded to such a high-work-function compound semiconductor, a difference between the bottom of the conduction band of silicon oxide and the Fermi level of the high-work-function compound semiconductor is 4.6 eV. This difference is larger than a difference between the bottom of the conduction band of silicon oxide and the Fermi level of an n-type silicon, which is 3.2 eV, or a difference between the bottom of the conduction band of silicon oxide and the Fermi level of an p-type silicon, which is 4.3 eV. Therefore, in the case where such a high-work-function compound semiconductor is used for the gate, a gate insulator serves as a higher potential barrier.

Accordingly, even when the gate insulator is made thinner, leakage of electric charge from the gate due to a tunneling effect can be prevented. It is necessary for the memory cell illustrated in FIG. 1 to retain electric charge in the storage node SN for a long time. When the gate insulator of the reading transistor RT is made thin, electric charge is likely to leak due to a tunneling effect. However, in order to suppress a short-channel effect due to miniaturization, the gate insulator needs to be made thin.

A material with a higher work function is used for the gate, whereby the potential barrier of the gate insulator is increased, so that a tunneling effect can be suppressed. Accordingly, the gate insulator can be made thinner. For example, when the thickness of the gate insulator is 5 nm, a reading transistor RT whose channel length is 17 nm can be manufactured. Although in the above-described example, silicon oxide is used for the gate insulator, the same applies to other insulating materials.

Figure 5A:
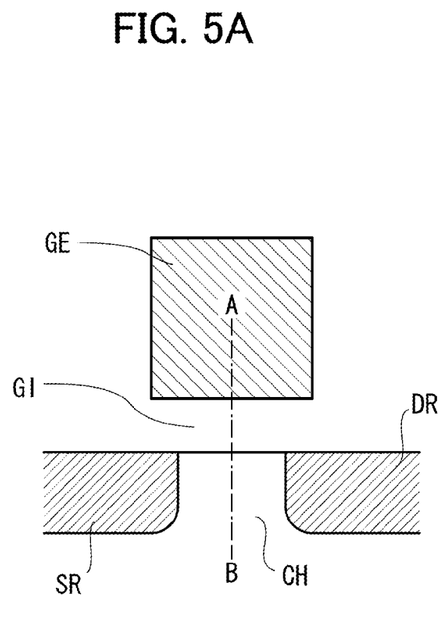
FIG. 5A is a diagram of a structure of a transistor.
Figure 5B:
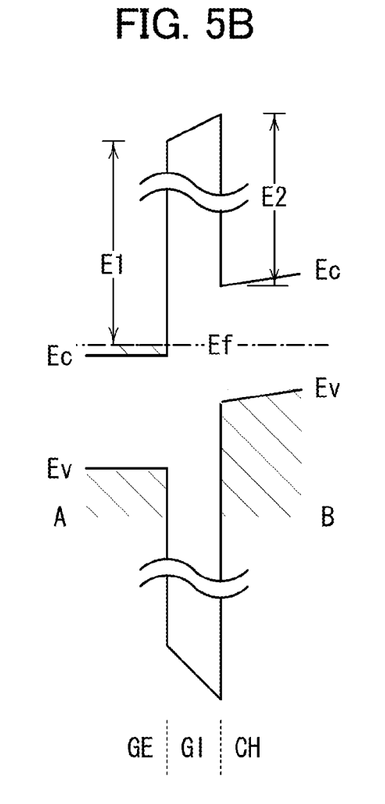
FIGS. 5B and 5C are band diagrams thereof.
Figure 5C:
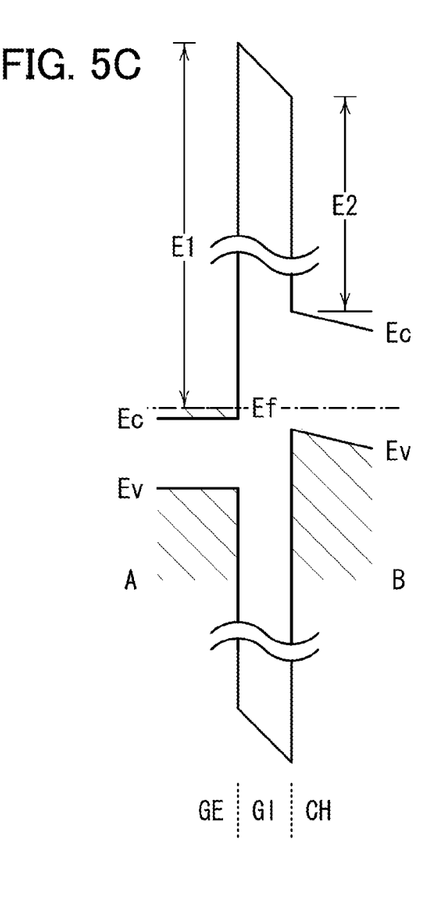

FIG. 5A is a schematic view of a N-channel transistor including a gate GE, a gate insulator GI, a region where a channel is formed CH, a source SR, and a drain DR. FIGS. 5B and 5C show examples of energy band conditions along line AB in a center portion of the transistor. Note that here, the potentials of the gate GE, the source SR, and the drain DR are equal to one another. Moreover, Ef represents the Fermi level, Ec represents the bottom of a conduction band, and Ev represents the top of a valence band.

FIG. 5B is an energy band diagram of a transistor in which a gate is formed using n-type silicon (the work function is 4.1 eV) and the region where the channel is formed CH is doped to become p-type. FIG. 5C is an energy band diagram of a transistor in which a gate is formed using indium nitride (the work function is 5.6 eV) and an impurity concentration in the region where the channel is formed CH is extremely low. The gate insulators GI in the transistors are each formed using silicon oxide.

Although the region where the channel is formed CH is doped to become p-type, in the case where the gate is formed using N-type silicon, the hole concentration in the vicinity of the surface becomes low due to an influence of the gate GE. Therefore, the threshold voltage decreases, and thus a short-channel effect is likely to occur. On the other hand, in the case where the gate is formed using indium nitride, the impurity concentration in the region where the channel is formed CH is extremely low; however, the hole concentration in the vicinity of the surface becomes high due to an influence of the gate GE. Accordingly, the threshold voltage increases, so that a short-channel effect can be sufficiently suppressed.

Note that since indium nitride is an n-type semiconductor as described above, the Fermi level Ef of indium nitride is substantially equal to or higher than the bottom Ec of the conduction band. FIG. 5C shows the state where indium nitride is degenerated and the carrier concentration is approximately $1 \times 10^{21}$ cm$^{-3}$. FIG. 5B shows the state where n-type silicon is degenerated and the carrier concentration is approximately $1 \times 10^{21}$ cm$^{-3}$.

Further, as is clear from comparison of FIG. 5B with FIG. 5C, the heights of the potential barriers of the gate insulators GI each existing between the gate GE and the region where the channel is formed CH are different from each other.

For example, in order that electrons at the Fermi level Ef of the gate GE in FIG. 5B reach the region where the channel is formed CH by thermal excitation, the electrons need to go over a barrier whose height is a sum of E2 and a difference between the bottom Ec of the conduction band of silicon and the Fermi level Ef in order to reach the region where the channel is formed CH by thermal excitation.

E2 in FIG. 5B is a difference between the electron affinity of silicon and the electron affinity of silicon oxide, which is 3.2 eV, and a difference between the bottom Ec of the conduction band of silicon and the Fermi level Ef is approximately 0.5 eV. Accordingly, the height of the barrier is 3.7 eV.

On the other hand, in order that electrons at the Fermi level Ef of the gate GE in FIG. 5C reach the region where the channel is formed CH, the electrons need to go over a barrier having a height E1. E1 is a difference between the work function of indium nitride and the electron affinity of silicon oxide, which is 4.7 eV. E1 is higher than the barrier in FIG. 5B by 1 eV.

In other words, the probability that electrons go over the potential barrier by thermal excitation depends on the height of the potential barrier. The probability in the case where the gate is formed using indium nitride (in the case of FIG. 5C) is much lower than that in the case where the gate is formed using n-type silicon (in the case of FIG. 5B). Although electrons can pass through the potential barrier by a tunneling effect, the probability (the tunneling probability) also depends on the height of the potential barrier. In other words, the probability in the case where the gate is formed using indium nitride (in the case of FIG. 5C) is lower than that in the case where the gate is formed using n-type silicon (in the case of FIG. 5B).

As described above, in the case where the gate is formed using indium nitride (or a material with a high work function like indium nitride), the potential barrier of the gate insulator GI becomes high, so that leak of electric charge from the gate GE can be reduced. In addition, as described above, since the hole concentration in the vicinity of the surface of the region where the channel is formed becomes high, a short-channel effect is easily suppressed, so that the gate insulator GI can be made thinner.

Note that as described above, the impurity concentration in the region where the channel is formed CH (in particular, in the vicinity of the surface) can be reduced, which is preferable in terms of suppression of a variation in threshold voltage due to the statistical fluctuation of impurity atoms (for example, K. Takeuchi et al., "*Channel Engineering for the Reduction of Random-Voltage-Induced Threshold Voltage Variation*", p. 841, IEDM (1997)).

In the above, an example in which silicon is used as a semiconductor with which the channel is formed is described; however, the same applies to a known semiconductor such as gallium arsenide, gallium phosphide, indium phosphide, silicon carbide, germanium, or silicon germanium.

DETAILED DESCRIPTION OF THE INVENTION

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

Further, in the description below, although specific values are given for easy understanding, the values can be changed for a variety of reasons such as a circuit configuration, element characteristics, or convenience of the practitioner, and the present invention is not limited to the values.

[Embodiment 1]

An example of a method for driving a semiconductor memory device according to one embodiment of the present invention will be described with reference to FIGS. 2A to 2D. A circuit of the memory cell used is the same as that illustrated in FIG. 1. In a manner similar to the case described in FIGS. 3A to 3D and FIGS. 4A and 4B, the potential of the bit line BL is set to 0 V or +1 V depending on data. In this embodiment, the threshold voltage of the writing transistor WT is set to +1 V, and the threshold voltage of the reading transistor RT is set to +1.5V. Further, the potential of the source line SL is fixed at 0 V in this embodiment. In order to achieve such a high threshold voltage, a high-work-function compound semiconductor may be used for the gate of the reading transistor RT.

At the time of data writing, for example, when the potential of the writing word line WWL is set to +2 V, the writing transistor WT is turned on. Here, the potential of the reading word line RWL is 0 V. In the case where the potential of the bit line BL is set to +1V, the potential of the storage node SN is +1 V. However, the threshold voltage of the reading transistor RT is +1.5 V; therefore, the reading transistor RT is off. Of course, in the case where the potential of the bit line BL is 0 V (the potential of the storage node SN is 0 V), the reading transistor RT is off (see FIG. 2A).

Figure 2A:
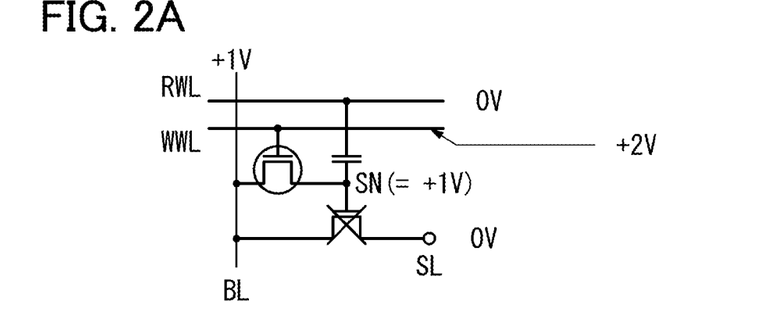
FIGS. 2A to 2D are diagrams illustrating an example of an operation of a semiconductor memory device according to the present invention.
Figure 2B:
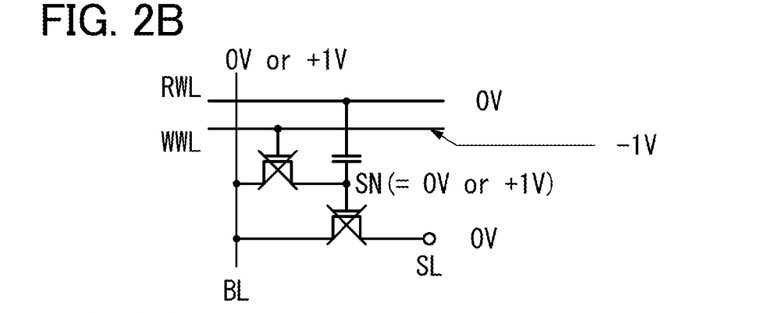

When the writing is completed, the potential of the writing word line WWL is set to −1V, and the writing transistor WT is turned off (see FIG. 2B). This state is a standby state. In this embodiment, the potential of the reading word line RWL does not need to be fluctuated at the time of the writing and at the time of completion of the writing (a standby state). Accordingly, the potential of the storage node SN is a potential (0 V or +1 V) in accordance with data. In other words, since the potential of the source of the writing transistor WT is greater than or equal to 0 V, the potential of the writing word line WWL can be set to −1 V.

Figure 2C:
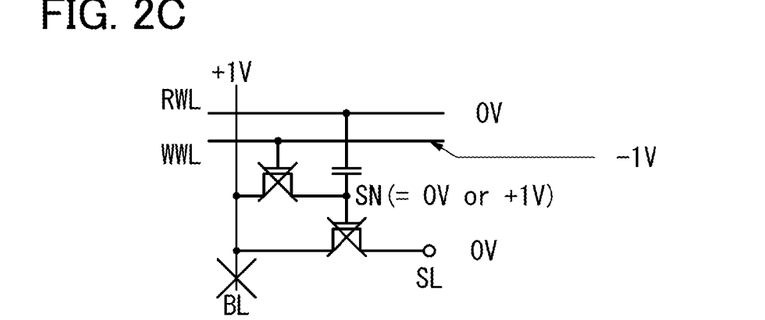

At the time of data reading, the bit line BL is charged so that the potential is +1V, and after that, the bit line BL is put in a floating state (see FIG. 2C). Further, the potential of the reading word line RWL is set to +1 V (see FIG. 2D). As a result, the potential of the storage node SN is +1 V or +2 V.

Figure 2D:
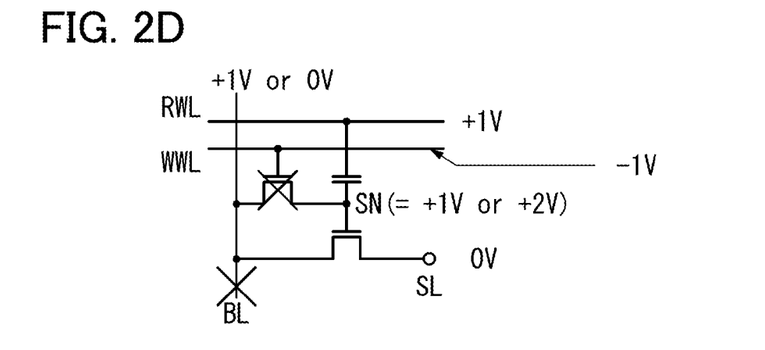

When the potential of the storage node SN is +1 V, the reading transistor RT is off, so that the potential of the bit line BL remains at +1 V. On the other hand, when the potential of the storage node SN is +2 V, the reading transistor RT is turned on, and the potential of the bit line BL is 0 V. Thus, by utilizing the fact that the potential of the bit line BL varies depending on stored data, data can be read.

As described above, the driving method described in this embodiment has the following features. A feature is that the potential of the source line SL can be fixed. In the above example, the potential of the source line SL is fixed at 0 V. Another feature is that the fluctuation range of the potential of the writing word line WWL is 3V, which is from −1 V to +2 V. Another feature is that the potential of the reading word line RWL may be fluctuated only at the time of reading. In the above example, the potential of the reading word line RWL is set to +1 V only at the time of reading, and the potential of the reading word line RWL is set to 0 V at the time other than the time of reading.

In other words, as compared to the method described in FIGS. 3A to 3D and FIGS. 4A and 4B, in the driving method of this embodiment, the fluctuation ranges of the potentials or the number of times of fluctuation of the potentials of the source line SL, the writing word line WWL, and the reading word line RWL can be made small, so that power consumption can be reduced.

[Embodiment 2]

A manufacturing process of a semiconductor memory device according to one embodiment of the present invention will be briefly described with reference to FIGS. 6A to 6D and FIGS. 7A to 7C. Refer to known semiconductor integrated circuit manufacturing techniques or Patent Document 2 or 3 for the details. Note that FIGS. 6A to 6D and FIGS. 7A to 7C illustrate the concepts of the manufacturing process and do not show specific cross sections.

Further, in this embodiment, an example in which silicon is used as a semiconductor used in a reading transistor is described; however, the same applies to a known semiconductor such as gallium arsenide, gallium phosphide, indium phosphide, silicon carbide, germanium, or silicon germanium.

Figure 6A:
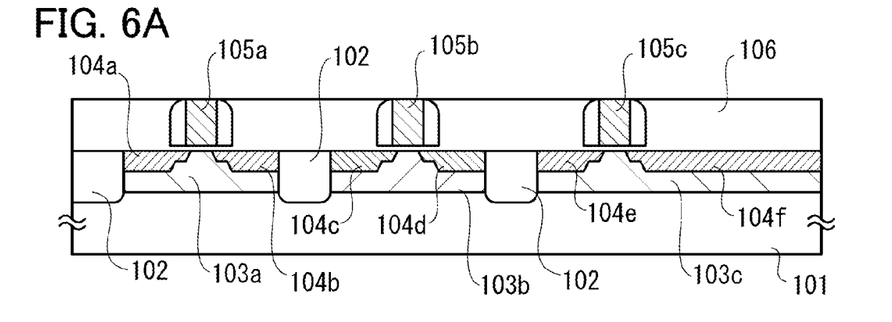
FIGS. 6A to 6D are diagrams illustrating an example of a manufacturing process of a semiconductor memory device according to the present invention.

<FIG. 6A>

First, by a known technique of manufacturing a semiconductor integrated circuit, an element separation insulator 102, a p-well 103a, an n-well 103b, a p-well 103c, an n-type impurity region 104a, an n-type impurity region 104b, a p-type impurity region 104c, a p-type impurity region 104d, an n-type impurity region 104e, an n-type impurity region 104f, a dummy gate 105a, a dummy gate 105b, a dummy gate 105c, and a first interlayer insulator 106 are formed on a surface of a substrate 101 of a semiconductor.

Further, the first interlayer insulator 106 is polished by a chemical mechanical polishing method to expose the dummy gate 105a, the dummy gate 105b, and the dummy gate 105c.

Note that a region where the p-well 103a, the n-well 103b, the n-type impurity region 104a, the n-type impurity region 104b, the p-type impurity region 104c, the p-type impurity region 104d, the dummy gate 105a, and the dummy gate 105b are provided is a region of a circuit (a driver circuit) for driving a memory cell. A region where the p-well 103c, the n-type impurity region 104e, the n-type impurity region 104f, and the dummy gate 105c are provided is a region of the memory cell.

Further, the n-type impurity region 104a and the n-type impurity region 104b each serve as a source or a drain of an n-channel transistor of the driver circuit. The p-type impurity region 104c and the p-type impurity region 104d each serve as a source or a drain of a p-channel transistor of the driver circuit. The n-type impurity region 104e and the n-type impurity region 104f each serve as a source or a drain of a reading transistor of the memory cell. Note that the n-type impurity region 104e is extended from the front in the depth direction in the drawing (i.e., in a direction parallel to a writing word line described later).

Figure 6B:
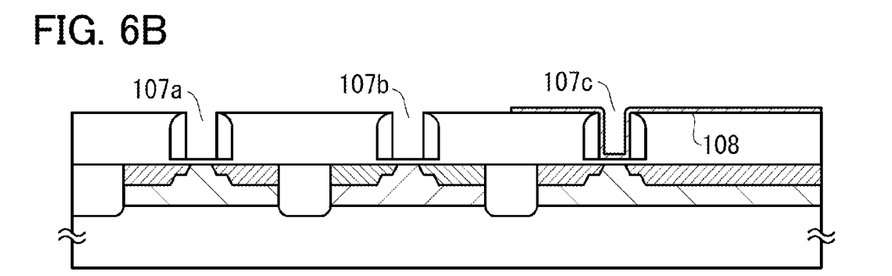

<FIG. 6B>

The dummy gate 105a, the dummy gate 105b, and the dummy gate 105c are removed, and thus a hole 107a, a hole 107b, and a hole 107c are formed. Then, a high-work-function compound semiconductor film 108 is formed only in the region of the memory cell.

The high-work-function compound semiconductor film 108 can be formed by a sputtering method, an ALD method, or a CVD method (a MOCVD method or the like). In particular, in a case where the gate insulator has a thickness less than or equal to 5 nm, the use of an ALD method or a CVD method which gives less damage on the substrate is preferable.

The thickness of the high-work-function compound semiconductor film 108 may be 5 nm to 100 nm. When the thickness is less than 5 nm, the work function does not affect a surface of the substrate 101; when the thickness is more than 100 nm, the resistance of the high-work-function compound semiconductor film 108 becomes high, which is not preferable for the characteristics of circuits.

Note that the high-work-function compound semiconductor film 108 may be provided only in a portion which is in contact with the gate insulator of the reading transistor of the memory cell and does not need to be provided on a side surface of the hole 107c. Accordingly, step coverage in the hole 107c is not problematic.

As described above, the defect levels in the vicinity of the interface serve as donors in the high-work-function compound semiconductor film 108; therefore, in a portion which is far from the interface, the donor concentration decreases and the conductivity remarkably deteriorates in some cases. In order to obtain the sufficient conductivity, additional doping with donors is necessary.

It is known that an example of indium-zinc-gallium oxide represented by the composition formula $InGaZnO_4$ has a crystal structure called a $YbFe_2O_4$ structure (see Non-Patent Document 1). However, for example, when 5 at. % or more of nitrogen is added to $InGaZnO_4$, the wurtzite type structure becomes a stable phase; accordingly, the electron state drastically changes. Since the wurtzite type structure is crystallized more easily than the $YbFe_2O_4$ structure, the crystallization is performed at relatively low temperature.

As for the electron state, for example, the $YbFe_2O_4$ structure has a band gap of approximately 3.2 eV, while the wurtzite structure has a band gap of 2.2 eV or less. As for the electron affinity, that of the former is approximately 4.6 eV, while that of the latter is 5.5 eV or more. Since the electron affinity is 4.9 eV or more, the N-type conductivity is exhibited due to the defect levels. Since hydrogen functions as a donor, the carrier concentration can be increased by adding hydrogen.

It is preferable that the high-work-function compound semiconductor film 108 contain oxygen 2 to 5 times as much as nitrogen besides nitrogen, zinc, tin, and indium, because the generation of trap levels at the interface with the gate insulator can be suppressed. Moreover, it is preferable that the high-work-function compound semiconductor film 108 contains hydrogen at 1 at. % to 10 at. % because the state of the interface is improved and the carriers are increased to improve the conductivity. Other than in the film formation step, the addition of hydrogen to the high-work-function compound semiconductor film 108 can be performed in hydrogenation treatment after the completion of a doping step.

Note that instead of indium-zinc-gallium oxide (In—Ga—Zn—O), for example, a two-component metal oxide such as In—Sn—O, Sn—Zn—O, Al—Zn—O, or In—Ga—O; a three-component metal oxide such as In—Sn—Zn—O, In—Al—Zn—O, Sn—Ga—Zn—O, Al—Ga—Zn—O, or Sn—Al—Zn—O; or a four-component metal oxide such as In—Sn—Ga—Zn—O may be used.

For example, In—Ga—Zn—O means an oxide containing indium (In), gallium (Ga), and zinc (Zn). Such an oxide can be used as an oxide semiconductor described later as long as the concentration of nitrogen contained therein is sufficiently low (less than or equal to 70 at. %, preferably less than or equal to 0.01 at. %).

Figure 6C:
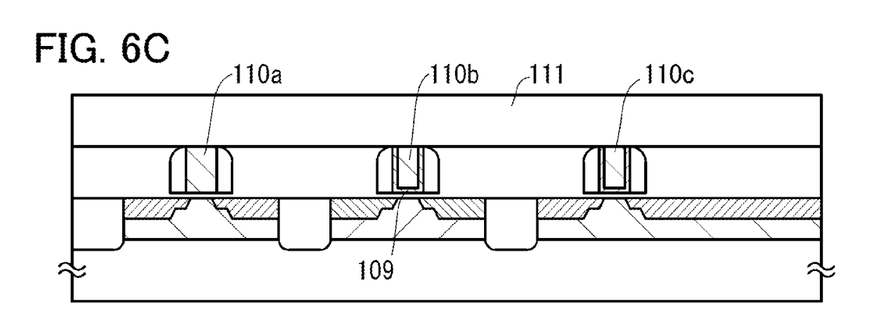

<FIG. 6C>

In the hole 107b where a p-channel transistor is formed, a first metal film 109 is formed using a material with an appropriate work function using a method similar to the method described in FIG. 6B. Further, a film which is appropriate for an n-channel transistor is formed using a material with high conductivity over the first interlayer insulator 106 so as to fill the holes 107a, 107b, and 107c.

Then, a surface of the film is polished to be planarized. As a result of this, the hole 107a, the hole 107b, and the hole 107c can be filled with a second metal film 110a, a second metal film 110b, and a second metal film 110c, respectively. At this time, the first metal film 109 remains on side surfaces and a bottom surface of the hole 107b, and the high-work-function compound semiconductor film 108 remains on side surfaces and a bottom surface of the hole 107c. In addition, a second interlayer insulator 111 is formed.

Figure 6D:
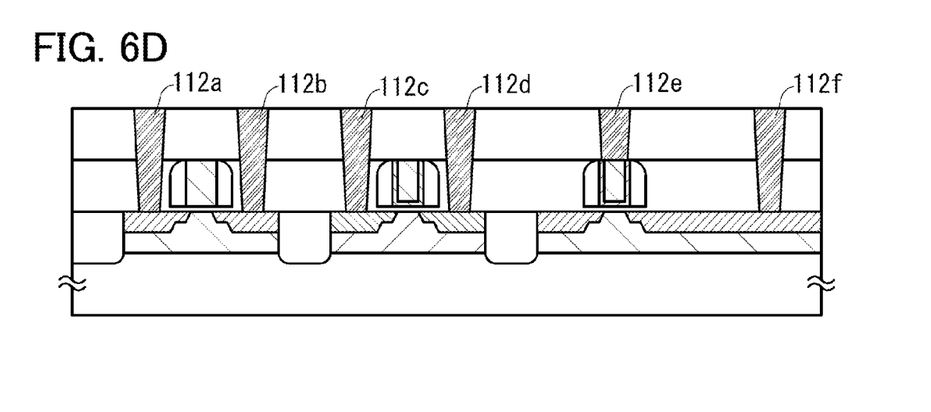

<FIG. 6D>

The second interlayer insulator 111 (and further the first interlayer insulator 106 if necessary) is/are etched to form contact holes reaching the n-type impurity region 104a, the n-type impurity region 104b, the p-type impurity region 104c, the p-type impurity region 104d, the second metal film 110c, and the n-type impurity region 104f.

Then, a first contact plug 112a, a first contact plug 112b, a first contact plug 112c, a first contact plug 112d, a first contact plug 112e, and a first contact plug 112f are formed in these contact holes.

Figure 7A:
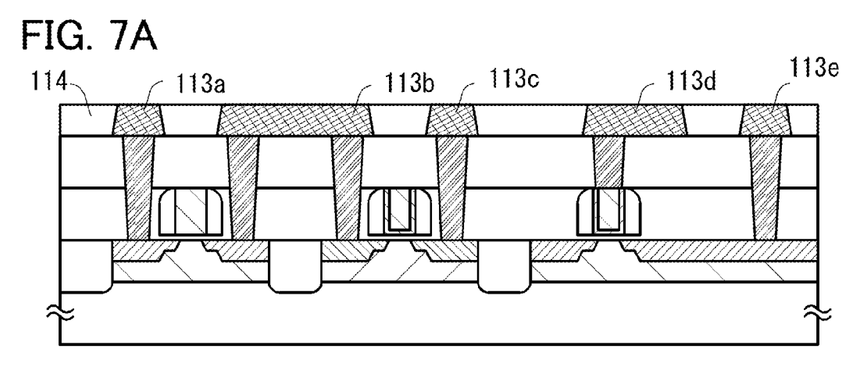
FIGS. 7A to 7C are diagrams illustrating an example of a manufacturing process of the semiconductor memory device according to the present invention.

<FIG. 7A>

A first layer wiring 113a, a first layer wiring 113b, a first layer wiring 113c, a first layer wiring 113d, and a first layer wiring 113e are formed so as to be embedded in a first embedment insulator 114. Note that as illustrated in FIG. 7A, the first layer wiring 113b connects the first contact plug 112b to the first contact plug 112c. Further, the first layer wiring 113d and the first layer wiring 113e each serve as a source or a drain of the writing transistor of the memory cell.

Note that another wiring including one or more layers, another contact plug, or the like may be provided between the first layer wirings 113a to 113e and the first contact plugs 112a to 112f.

Figure 7B:
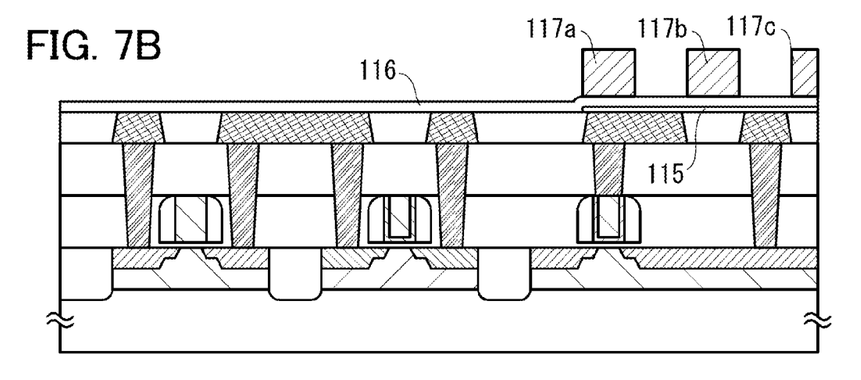

<FIG. 7B>

A semiconductor layer 115 is formed, and a gate insulator 116 is formed so as to cover the semiconductor layer 115. Silicon or an oxide semiconductor having a thickness less than or equal to 5 nm, preferably less than or equal to 2 nm can be used for the semiconductor layer 115. At this time, it is preferable that the physical thickness of the gate insulator 116 be twice or more times that of the semiconductor layer 115 because the semiconductor layer 115 can be covered with the gate insulator 116 reliably, whereby shorts between wirings can be prevented.

On the other hand, it is preferable that the effective thickness of the gate insulator (e.g., equivalent oxide thickness) be less than or equal to that of the semiconductor layer 115. Therefore, it is preferable that the gate insulator 116 be formed of a material whose dielectric constant is twice that of the semiconductor layer 115.

For example, the gate insulator 116 may be formed using a high dielectric constant material such as hafnium oxide, tantalum oxide, or zirconium oxide. Note that in the case where an oxide semiconductor is used for the semiconductor layer 115, barium oxide, strontium oxide, calcium oxide, lithium oxide, or the like can be used. These materials which forms silicide by reacting with silicon have been prevented from being used with silicon semiconductor, but may be used with an oxide semiconductor without problems. Therefore, any of these materials can be used for the gate insulator 116 as long as it has high dielectric constant.

Note that in the case where silicon having the above thickness is used for the semiconductor layer 115, the off-state current is relatively large; therefore, data is preferably read and rewritten (refreshed) in an appropriate cycle. Further, also in the case where an oxide semiconductor is used for the semiconductor layer 115, a refresh operation may be performed in an appropriate cycle.

Further, a second layer wiring 117a, a second layer wiring 117b, and a second layer wiring 117c are formed. Here, the second layer wiring 117a serves as a reading word line, the second layer wiring 117b serves as a writing word line, and the second layer wiring 117c serves as a writing word line for an adjacent memory cell.

Figure 7C:
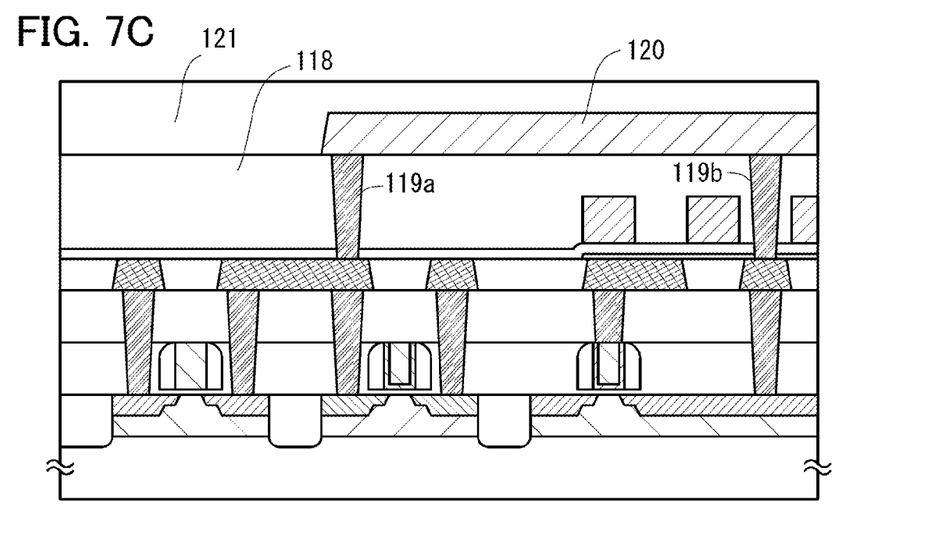

<FIG. 7C>

A third interlayer insulator 118, a second contact plug 119a, and a second contact plug 119b are formed. Then, a third layer wiring 120 and a fourth interlayer insulator 121 are formed thereover. The third layer wiring 120 serves as a bit line. Thus, the semiconductor memory device can be manufactured.

This application is based on Japanese Patent Application serial no. 2011-143668 filed with Japan Patent Office on Jun. 29, 2011, the entire contents of which are hereby incorporated by reference.

What is claimed is:

1. A semiconductor device comprising:
   a writing word line;
   a reading word line;
   a bit line;
   a source line;
   a writing transistor, wherein a gate of the writing transistor is electrically connected to the writing word line;
   a reading transistor, wherein a drain of the reading transistor and a drain of the writing transistor are electrically connected to the bit line, and a source of the reading transistor is electrically connected to the source line; and
   a capacitor, wherein one electrode of the capacitor is electrically connected to a source of the writing transistor and a gate of the reading transistor,
   wherein an absolute value of a threshold voltage of the reading transistor is larger than a fluctuation range of a data potential of the bit line, and
   wherein the gate of the reading transistor comprises a compound containing nitrogen and at least one of indium and zinc.

2. The semiconductor device according to claim 1, wherein a value obtained by subtracting a minimum potential of the writing word line from a minimum potential of the bit line is higher than or equal to 0.5 V.

3. The semiconductor device according to claim 1, wherein the writing transistor comprises an oxide semiconductor.

4. The semiconductor device according to claim 1, wherein the writing transistor comprises a semiconductor with a band gap higher than or equal to 2.5 eV.

5. The semiconductor device according to claim 1, wherein the reading transistor comprises single crystal silicon.

6. The semiconductor device according to claim 1, wherein the compound further contains oxygen 2 to 5 times of contained nitrogen in the compound.

7. A semiconductor device comprising:
   a writing word line;
   a reading word line;
   a bit line;
   a source line;
   a writing transistor, wherein a gate of the writing transistor is electrically connected to the writing word line;
   a reading transistor, wherein a drain of the reading transistor and a drain of the writing transistor are electrically connected to the bit line, and a source of the reading transistor is electrically connected to the source line; and
   a capacitor, wherein one electrode of the capacitor is electrically connected to a source of the writing transistor and a gate of the reading transistor,
   wherein the gate of the reading transistor comprises a compound containing nitrogen and at least one of indium and zinc, the compound having a work function higher than or equal to 5.2 eV.

8. The semiconductor device according to claim 7, wherein a value obtained by subtracting a minimum potential of the writing word line from a minimum potential of the bit line is higher than or equal to 0.5 V.

9. The semiconductor device according to claim 7, wherein the writing transistor comprises an oxide semiconductor.

10. The semiconductor device according to claim 7, wherein the writing transistor comprises a semiconductor with a band gap higher than or equal to 2.5 eV.

11. The semiconductor device according to claim 7, wherein the reading transistor comprises single crystal silicon.

12. The semiconductor device according to claim 7, wherein the compound further contains oxygen 2 to 5 times of contained nitrogen in the compound.

13. A method for driving a semiconductor device, the semiconductor device comprising: a writing word line; a reading word line; a bit line; a source line; a writing transistor, wherein a gate of the writing transistor is electrically connected to the writing word line; a reading transistor, wherein a drain of the writing transistor and a drain of the reading transistor are electrically connected to the bit line and a source of the reading transistor is connected to the source line; and a capacitor, wherein one electrode of the capacitor is electrically connected to a source of the writing transistor and a gate of the reading transistor, and wherein the gate of the reading transistor comprises a compound containing nitrogen and at least one of indium and zinc, the method comprising a step of:
   applying a data potential to the bit line, wherein a fluctuation range of the data potential to the bit line is smaller than an absolute value of a threshold voltage of the reading transistor.

14. The method for driving a semiconductor device according to claim 13, wherein a potential of the source line is fixed.

* * * * *